(12) United States Patent
Chen (10) Patent No.: US 7,337,718 B2
(45) Date of Patent: Mar. 4, 2008

(54) TWO-BAR LINKAGE FAST ELEVATING APPARATUS FOR SCREEN PRINTING MACHINE

(75) Inventor: Tung Chin Chen, Taipei (TW)

(73) Assignee: Atma Champ Enterprise Corporation, Taipei (TW)

( * ) Notice: Subject to any disclaimer, the term of this patent is extended or adjusted under 35 U.S.C. 154(b) by 63 days.

(21) Appl. No.: 11/441,354

(22) Filed: May 26, 2006

(65) Prior Publication Data
US 2007/0272102 A1    Nov. 29, 2007

(51) Int. Cl.
*B41F 15/16*    (2006.01)
*B41F 15/08*    (2006.01)
(52) U.S. Cl. .................. 101/126; 101/123; 101/114
(58) Field of Classification Search ............... 101/114, 101/123, 124, 126, 127.1, 129
See application file for complete search history.

(56) References Cited

U.S. PATENT DOCUMENTS 3,859,917 A * 1/1975 Bubley et al. ............ 101/123
5,694,843 A * 12/1997 Chen ........................ 101/123
7,047,879 B2 * 5/2006 Chen ........................ 101/126

FOREIGN PATENT DOCUMENTS

JP        63154350 A *  6/1988

* cited by examiner

*Primary Examiner*—Leslie J Evanisko
(74) *Attorney, Agent, or Firm*—Rabin & Berdo, PC (57) ABSTRACT

A two-bar linkage fast elevating apparatus for screen printing machine includes a two-bar linkage system and an eccentric shaft driving system connected to a rear side of a transverse slide base of the screen printing machine. A reduction motor is connected to a lower end of the eccentric shaft driving system to cyclically lift and lower the eccentric shaft driving system. When the eccentric shaft driving system is lifted to elevate the transverse slide base, the two-bar linkage system synchronously moves the transverse slide base backward, so that a heightened and deepened space giving good vision is provided between a printing bed and a lifted screen of the screen printing machine for an operator to safely, conveniently, and accurately check the printing quality.

10 Claims, 10 Drawing Sheets

TWO-BAR LINKAGE FAST ELEVATING APPARATUS FOR SCREEN PRINTING MACHINE

FIELD OF THE INVENTION

The present invention relates to a two-bar linkage fast elevating apparatus, and more particularly to a fast elevating apparatus that employs a two-bar linkage system and an eccentric shaft driving system to rearward lift a printing structure of a screen printing machine to produce a sufficient space with good vision above a printing bed of the machine, so that an operator may safely and accurately check the quality of printed objects.

BACKGROUND OF THE INVENTION

A cantilever-type screen printing machine is one of many important printing machines and is particularly suitable for precision printing on circuit boards. This type of screen printing machine typically includes a platform having an upper surface defining a printing bed, an elevating slide base provided to one lateral side of the platform, a transverse slide base mounted on the elevating slide base to move leftward and rightward, a cantilevered printing head forward extended from the transverse slide base and adapted to slide leftward and rightward, a cantilevered arm forward extended from each lateral side of the transverse slide base, and a clamping support is provided at a lower side of each of the two cantilevered arm for holding a screen frame between the two cantilevered arms. When an object to be printed is positioned on the printing bed, the printing head is pneumatically or electrically driven to transversely move and scrape ink on the screen. At this point, the printing head produces a downward pressure, causing the ink to penetrate through the screen to the object to be printed and create a printing effect via a pattern on the screen.

Currently, there are many different types of screen printing machines available in the market, including cantilever type, four-pillar type, electric type, electric vertical type, pneumatic type, etc. All these types of screen printing machines have almost the same elevating mechanism and driving means. Moreover, the conventional screen printing machines all are vertically elevated and lowered in the process of printing. Generally, the screen printing machine includes the operating procedures of applying an adequate amount of ink on the screen, driving the printing head to reciprocate on the screen from one side to the other side for the ink to penetrate the screen to the object to be printed, actuating the elevating slide base to vertically elevate the printing head and the screen frame, sliding the printing head to an initial position, and lowering the elevating slide base again to start the next printing. Each time the printing is completed, an operator would check the printing quality by removing the printed object from a very limited space between the printing bed and the elevated screen and printing head. Due to the limited space, it is relatively difficult for the operator to position and remove the objects to be printed or having been printed, and the productivity of the screen printing machine is adversely affected.

Since the elevating and the transverse slide base in the conventional screen printing machines are pneumatically driven and could not be quickly actuated under control, the conventional screen printing machines fail to achieve fast and high-quality printing to satisfy the market demands.

It is therefore desirable to improve the conventional screen printing machines to overcome the above-mentioned drawbacks.

SUMMARY OF THE INVENTION

A primary object of the present invention is to provide a two-bar linkage fast elevating apparatus for screen printing machine, so that the screen printing machine can perform high-speed and high-precision printing operation.

Another object of the present invention is to provide a two-bar linkage fast elevating apparatus consisting of a two-bar linkage system and an eccentric shaft driving system for use with a screen printing machine. The two-bar linkage system and the eccentric shaft driving system are connected to a transverse slide base of the screen printing machine, and are driven by a reduction motor mounted at a lower part of a platform of the machine to quickly lift and lower the transverse slide base.

A further object of the present invention is to provide a two-bar linkage fast elevating apparatus consisting of a two-bar linkage system and an eccentric shaft driving system for use with a screen printing machine. The two-bar linkage system and the eccentric shaft driving system are connected to a transverse slide base of the screen printing machine, and are driven by a reduction motor mounted at a lower part of a platform of the machine to quickly lift while rearward moves the transverse slide base, so that a space between the lifted screen and printing head held to a front side of the transverse slide base and the printing bed has increased height and depth to provide good vision for an operator to easily check the printing quality.

A still further object of the present invention is to provide a two-bar linkage fast elevating apparatus consisting of a two-bar linkage system and an eccentric shaft driving system for use with a screen printing machine. The eccentric shaft driving system includes a cylinder that is able to buffer or absorb an instantaneous impact produced by a reduction motor at the instant of lifting or lowering the eccentric shaft driving system, so as to ensure the precision and durability of the screen printing machine.

To achieve the above objects, the two-bar linkage fast elevating apparatus according to the present invention is used with a screen printing machine that includes a platform, a printing bed, and a transverse slide base. The transverse slide base has a cantilevered printing head forward extended therefrom to leftward and rightward slide along the transverse slide base, and is provided at two lateral ends thereof with two forward extended cantilevered arms, and each of the two cantilevered arms is provided at a lower side with a clamping support for holding a screen frame between the two cantilevered arms.

The two-bar linkage fast elevating apparatus according to the present invention is connected to a rear side of the transverse slide base of the screen printing machine, and includes a two-bar linkage system and an eccentric shaft driving system.

The two-bar linkage system includes a seat having a support upward extended from each lateral side thereof; two fixing plates symmetrically assembled to predetermined positions on inner wall surfaces of the two supports; two upper and two lower connecting bars, each of which has a first and a second end; an upper and a lower connecting shaft extended between the two fixing plates with two ends extended through the first end of the upper and lower connecting bars, respectively, into upper and lower ends, respectively, of the two fixing plates; a link bar extended between the two upper connecting bars with two ends extended through two upper shaft holes separately provided at rear portions of two connecting blocks and then into the second end of the two upper connecting bars; and two fixing shafts assembled to the second end of the two lower connecting bars to connect the two lower connecting bars to two lower shaft holes separately provided at the rear portion of the two connecting blocks.

The eccentric shaft driving system includes a rod bearing located at an upper end of the eccentric shaft driving system; a force applying rod assembled to the rod bearing; two fixing members fixedly connected to two ends of the force applying rod; a transmission block fixedly connected to a front side of the two fixing members; and a pivoting support provided at a lower end of the eccentric shaft driving system.

The two-bar linkage system and the eccentric shaft driving system are connected at the two connecting blocks and the transmission block, respectively, to the rear side of the transverse slide base.

Each of the two supports on the seat of the screen printing machine is provided at a predetermined position with a buffering device, and the buffering device may be of an air type, an oil pressure type, or other mechanical type buffering device.

In an embodiment of the present invention, each of the two fixing plates in the two-bar linkage system is provided at the upper and lower ends with an upper and a lower mounting hole, respectively, into which two ends of the upper and lower connecting shafts are extended; and each of the upper and lower connecting bars in the two-bar linkage system is provided at the first and the second end with a hole each, through which two ends of the upper and lower connecting shafts, of the fixing shafts, and of the link bar are extended.

In an operable embodiment of the present invention, the pivoting support in the eccentric shaft driving system is connected to a reduction motor.

In a preferred embodiment of the present invention, the two-bar linkage system is covered with a top cover.

In a most preferred embodiment of the present invention, the eccentric shaft driving system includes a height-adjustable adjusting screw rod downward extended from the rod bearing, and a cylinder connected to a lower end of the adjusting screw rod.

To assemble the present invention, first mount the two supports to two lateral sides of the seat, and then mount the two fixing plates to predetermined positions on inner wall surfaces of the two supports. Thereafter, connect the upper and lower connecting bars at the first end to the upper and the lower mounting holes, respectively, on the two fixing plates, and extend two ends of the upper and lower connecting shafts through the first end of the two upper and the two lower connecting bars, respectively, into the upper and the lower mounting holes, respectively, of the two fixing plates, and mount the fixing shafts to the second end of the two lower connecting bars. Then, extend two ends of the link bar through the two upper shaft holes on the two connecting blocks and then into the second end of the two upper connecting bars, and connect the fixing shafts at the second end of the two lower connecting bars to the two lower shaft holes on the two connecting blocks, such that the upper and the lower connecting bars are parallelly spaced from one another. Thereafter, assemble the force applying rod to the rod bearing at the upper end of the eccentric shaft driving system, connect the fixing members to two ends of the force applying rod and to the rear side of the transmission block, and connect the pivoting support at the lower end of the eccentric shaft driving system to the reduction motor. Finally, connect the two connecting blocks and the transmission block to the rear side of the transverse slide base of the screen printing machine.

When the present invention is in use, the reduction motor operates at a high speed to drive the eccentric shaft driving system to together with the two-bar linkage system stably lift or lower the transverse slide base at a high speed. The reduction motor is designed to rotate cyclically to change the working position of the two-bar linkage fast elevating apparatus. When the eccentric shaft driving system is in the lowest or printing position, the printing head of the screen printing machine is moved transversely to scrape ink on the screen, and produces a downward pressure against the screen, causing the ink to penetrate through the screen to an object to be printed. When the printing is completed, the reduction motor lifts while rearward moves the transverse slide base of the screen printing machine to the highest or standby position, enabling the operator to more conveniently and quickly position the object to be printed, check the printing quality, or remove the printed object from the printing bed. The enlarged space between the lifted screen and the printing bed of the screen printing machine provides good vision for the operator to accurately inspect the printing quality, so as to ensure increased good yield and productivity from the printing operation.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
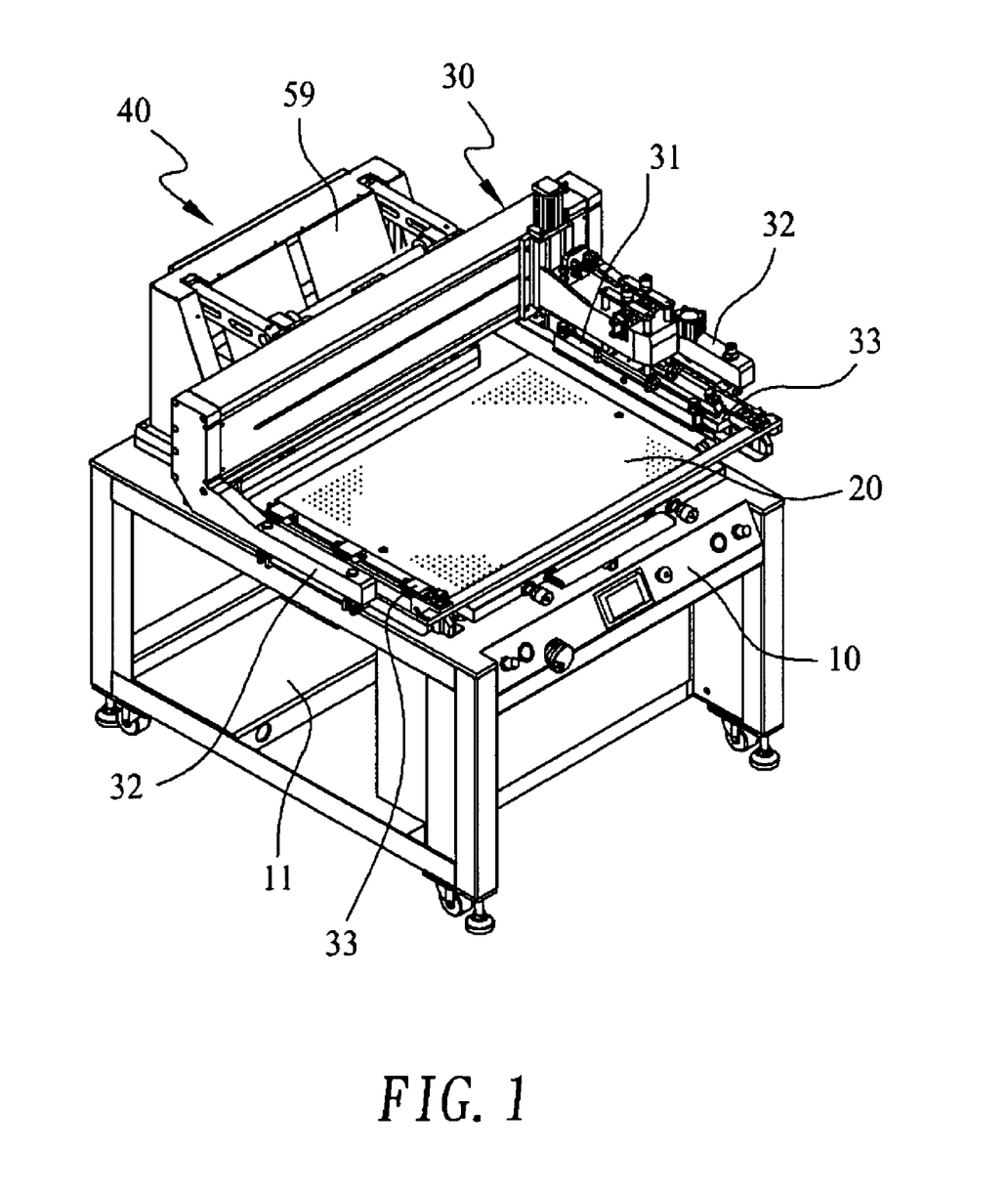
FIG. 1 is an assembled perspective view of a screen printing machine equipped with a two-bar linkage fast elevating apparatus of the present invention.
Figure 2:
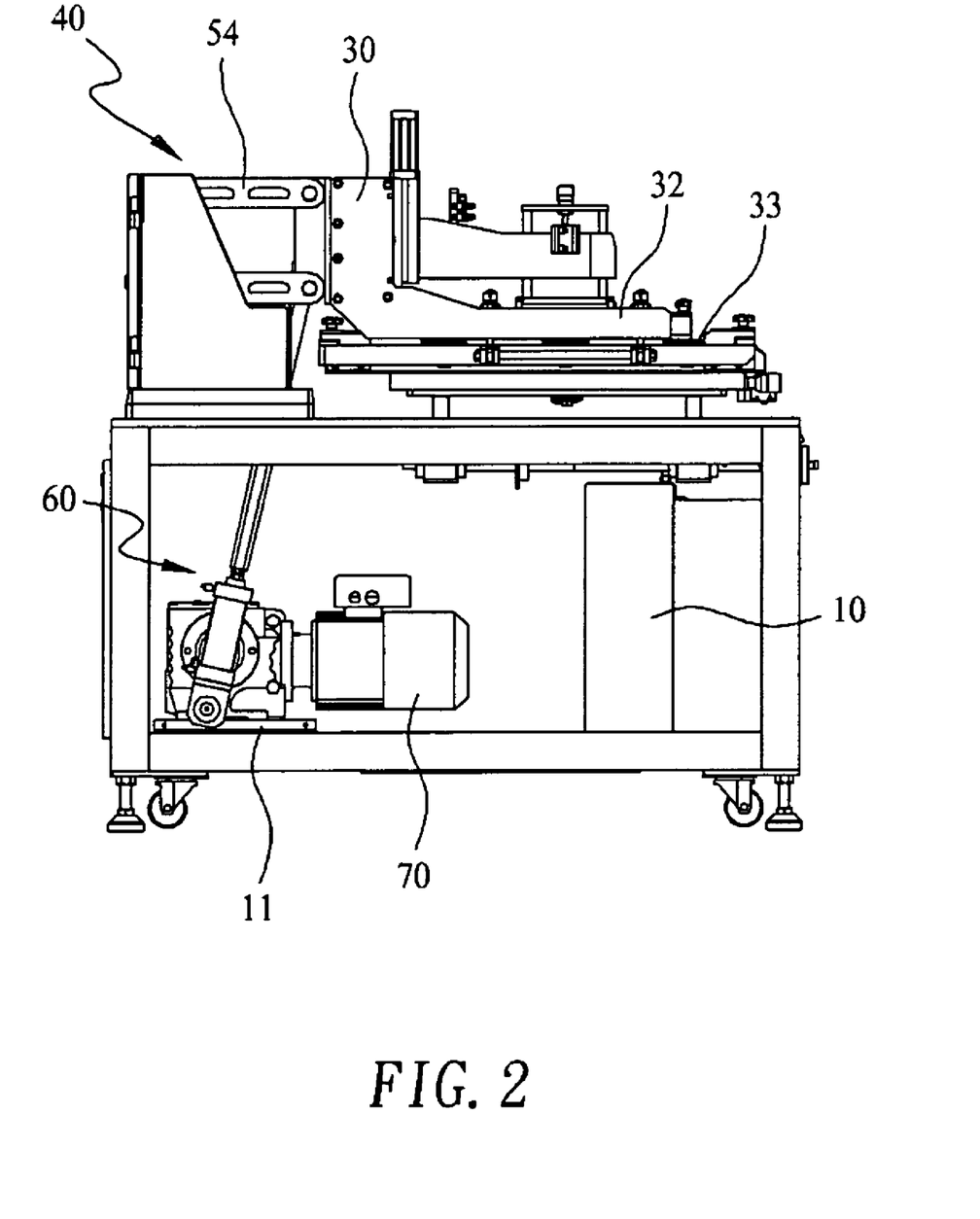
FIG. 2 is a side view of FIG. 1.

Please refer to FIGS. 1 and 2 that are assembled perspective and side views, respectively, showing a screen printing machine 1 equipped with a two-bar linkage fast elevating apparatus 40 according to a preferred embodiment of the present invention. The illustrated screen printing machine 1 is a cantilever-type screen printing machine basically including a platform 10, a printing bed 20, a transverse slider 30, the two-bar linkage fast elevating apparatus 40, and other related mechanisms. The transverse slide base 30 has a cantilevered printing head 31 forward extended therefrom to leftward and rightward slide along the transverse slide base 30, and is provided at two lateral ends thereof with two forward extended cantilevered arms 32. Each of the two cantilevered arms 32 is provided at a lower side with a clamping support 33 for holding a screen frame between the two cantilevered arms 32. The two-bar linkage fast elevating apparatus 40 is connected to a rear side of the transverse slide base 30.

Figure 3:
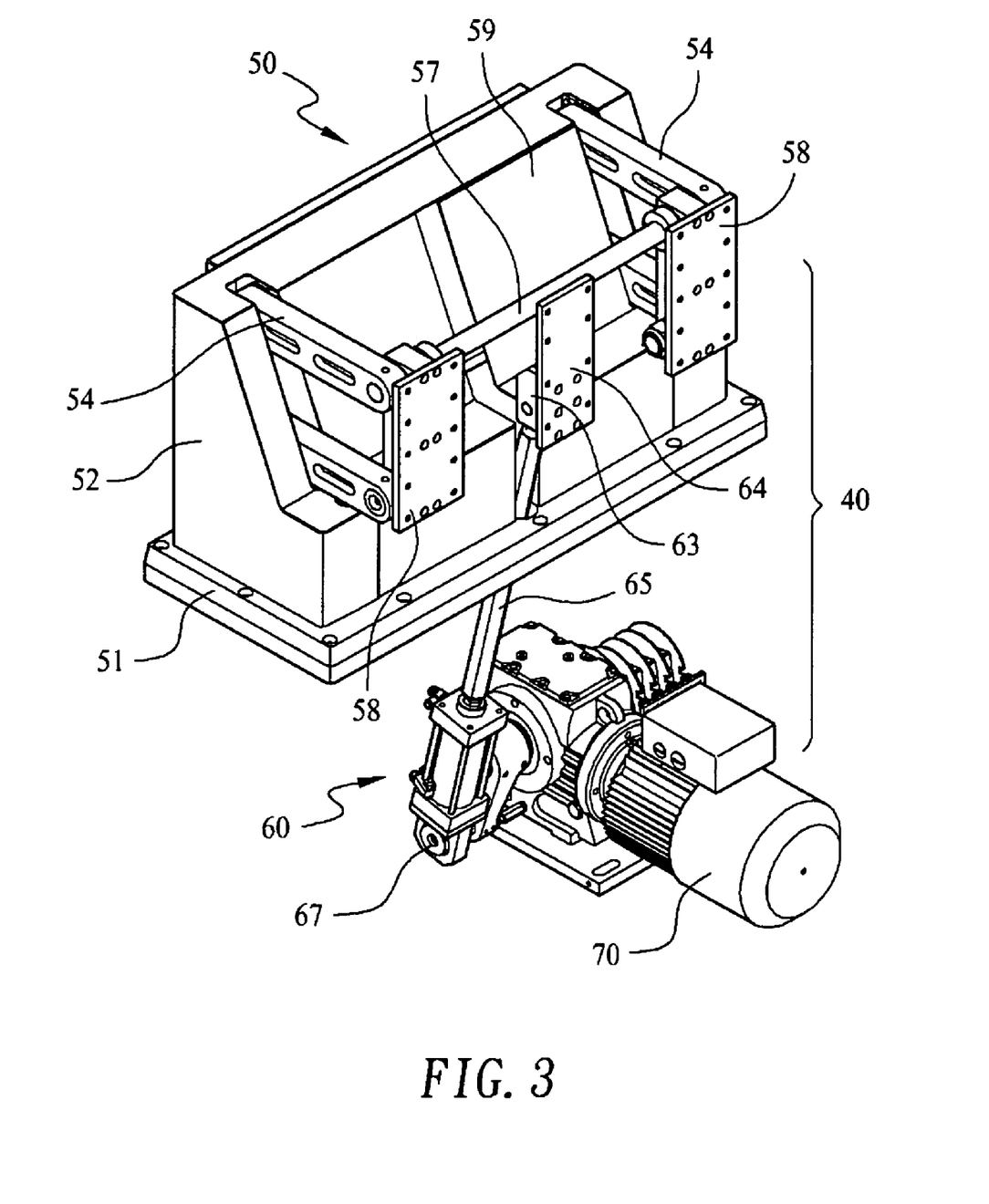
FIG. 3 is a perspective view of the two-bar linkage fast elevating apparatus of the present invention.

FIG. 3 is a perspective view of the two-bar linkage fast elevating apparatus for screen printing machine according to a preferred embodiment of the present invention. As shown, the two-bar linkage fast elevating apparatus 40 includes a two-bar linkage system 50 and an eccentric shaft driving system 60.

Figure 4:
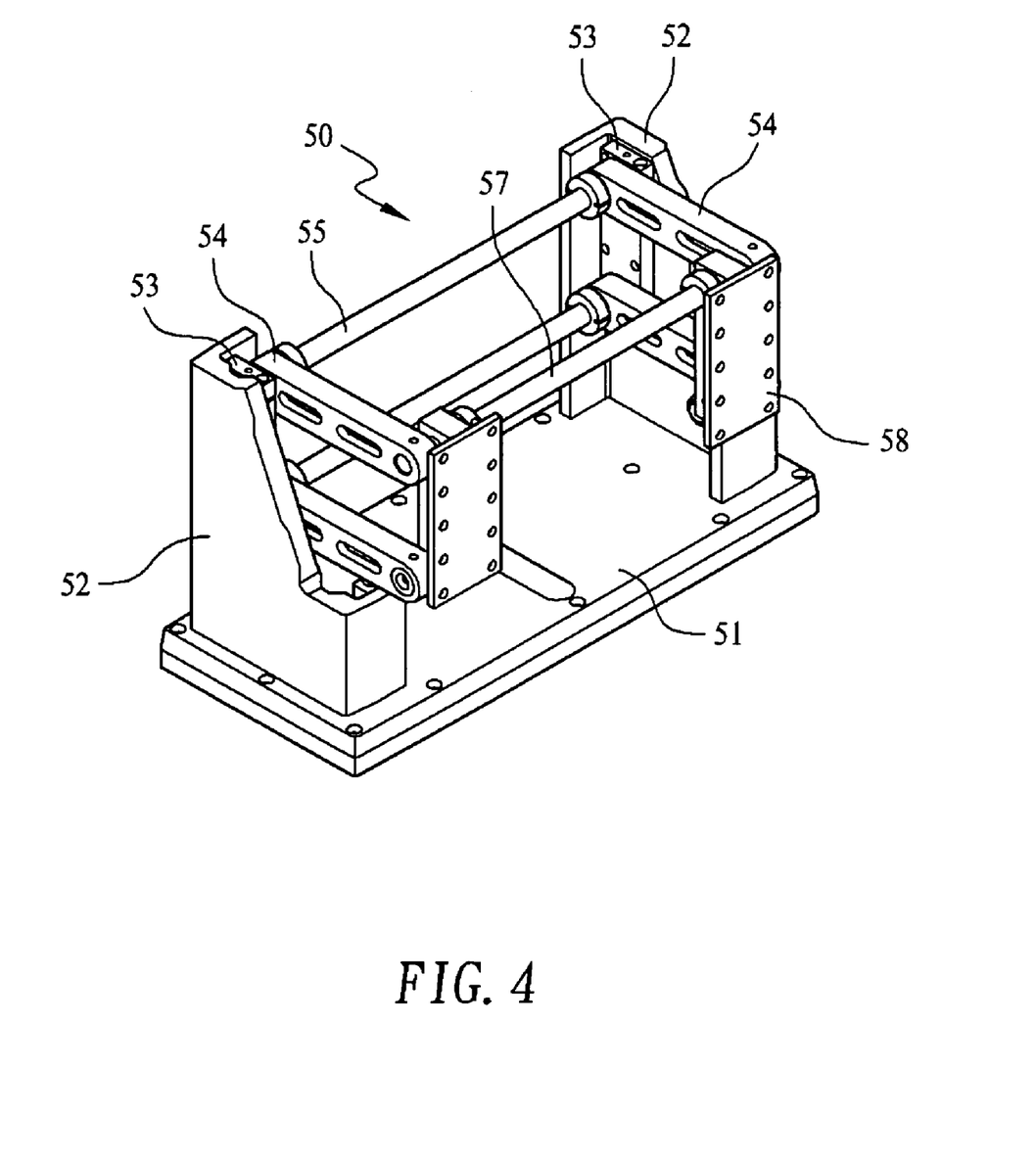
FIG. 4 is an assembled perspective view of a two-bar linkage system included in the present invention.
Figure 5:
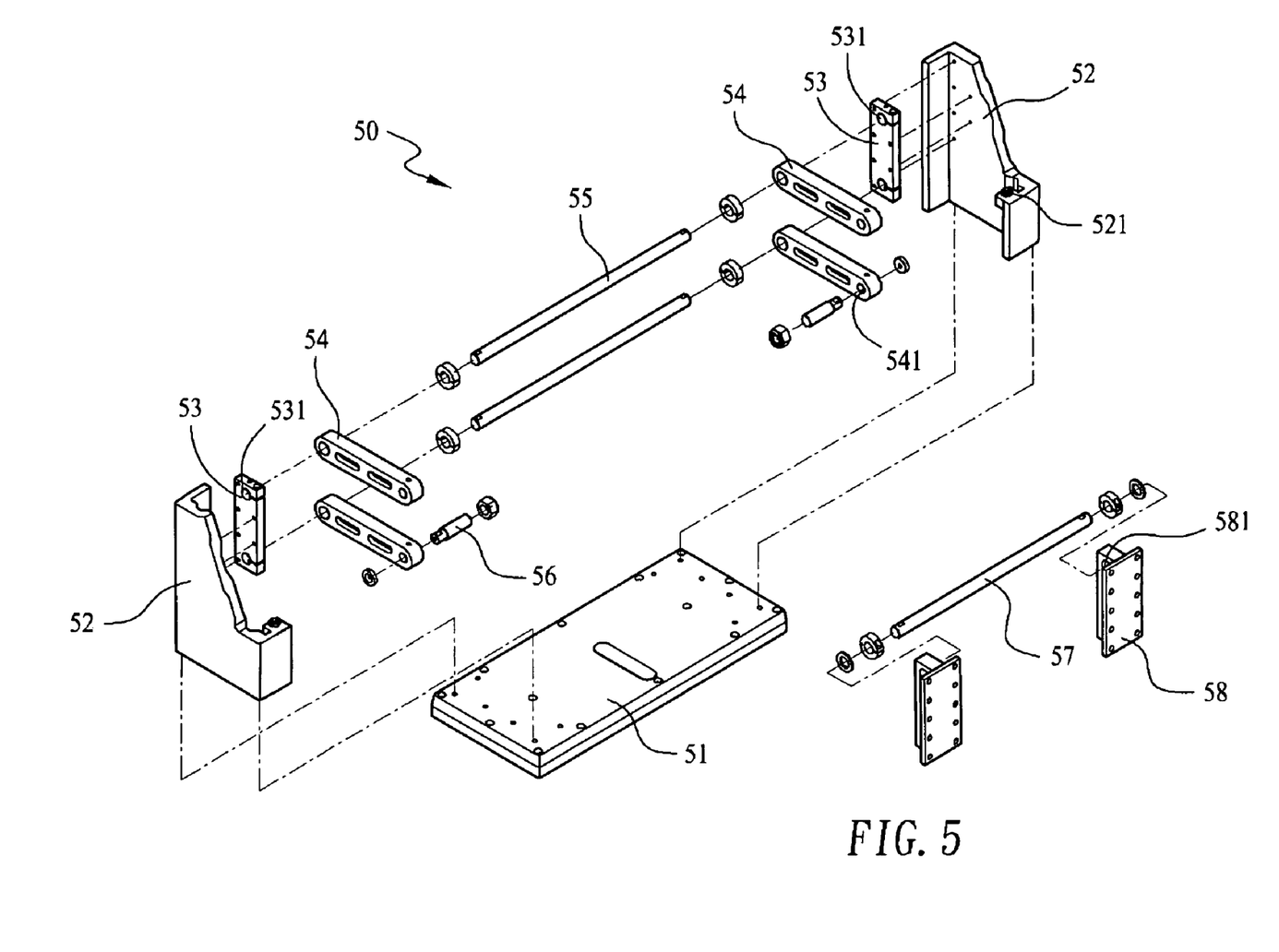
FIG. 5 is an exploded view of FIG. 4.

Please refer to FIGS. 4 and 5 that are assembled and exploded perspective views, respectively, of the two-bar linkage system 50. As shown, the two-bar linkage system 50 includes a seat 51 provided with a plurality of screw holes, and a support 52 upward extended from each lateral side of the seat 51. Each of the two supports 52 has a front end and a rear end that are different in height. A buffering device 521 is provided on a top of the front end, which is lower than the rear end. Two fixing plates 53, each of which is provided with an upper and a lower mounting hole 531, are symmetrically assembled to predetermined positions on inner wall surfaces of the two supports 52. An upper and a lower connecting bar 54, which have a predetermined length and are provided near two ends with a hole 541 each, are connected at a first end hole 541 to the upper and the lower mounting hole 531, respectively, on each of the two fixing plates 53. An upper and a lower connecting shaft 55 are extended between the two fixing plates 53 with two ends extended through the first end holes 541 of the two upper and the two lower connecting bars 54, respectively, into the upper and the lower mounting holes 531, respectively, of the two fixing plates 53. Each of the two lower connecting bars 54 has a fixing shaft 56 connected at an end to a second end hole 541 of the lower connecting bar 54. A link bar 57 is extended between the two upper connecting bars 54 with two ends extended through two upper shaft holes 581 separately provided at rear portions of two connecting blocks 58 and then into the second end holes 541 on the two upper connecting bars 54. The fixing shafts 56 assembled to the second end holes 541 of the two lower connecting bars 54 are separately connected at the opposite end to two lower shaft holes 581 on the rear portions of the two connecting blocks 58, such that the upper and the lower connecting bars 54 are parallelly spaced from one another. When the two-bar linkage system 50 is fully assembled, as shown in FIG. 4, a top cover 59 may be provided to protectively cover the two-bar linkage system 50, as shown in FIG. 3.

The buffering device 521 provided at the top of the front end of each support 52 serves to buffer an impact of the upward and downward moved connecting bars 54 on the support 52, and may be of an air-type, an oil-pressure-type, or other mechanical-type structure.

Figure 6:
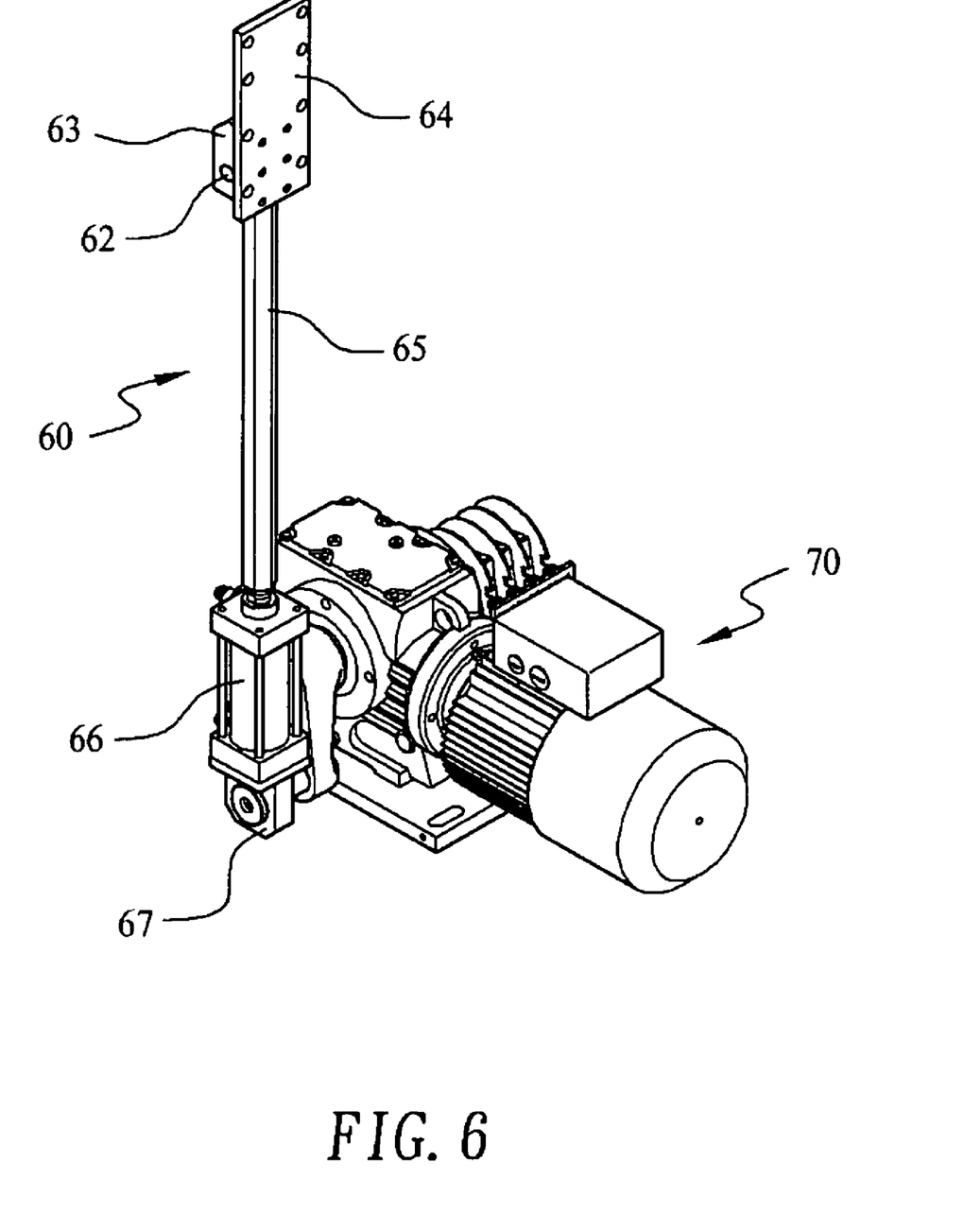
FIG. 6 is an assembled perspective view of an eccentric shaft driving system included in the present invention.
Figure 7:
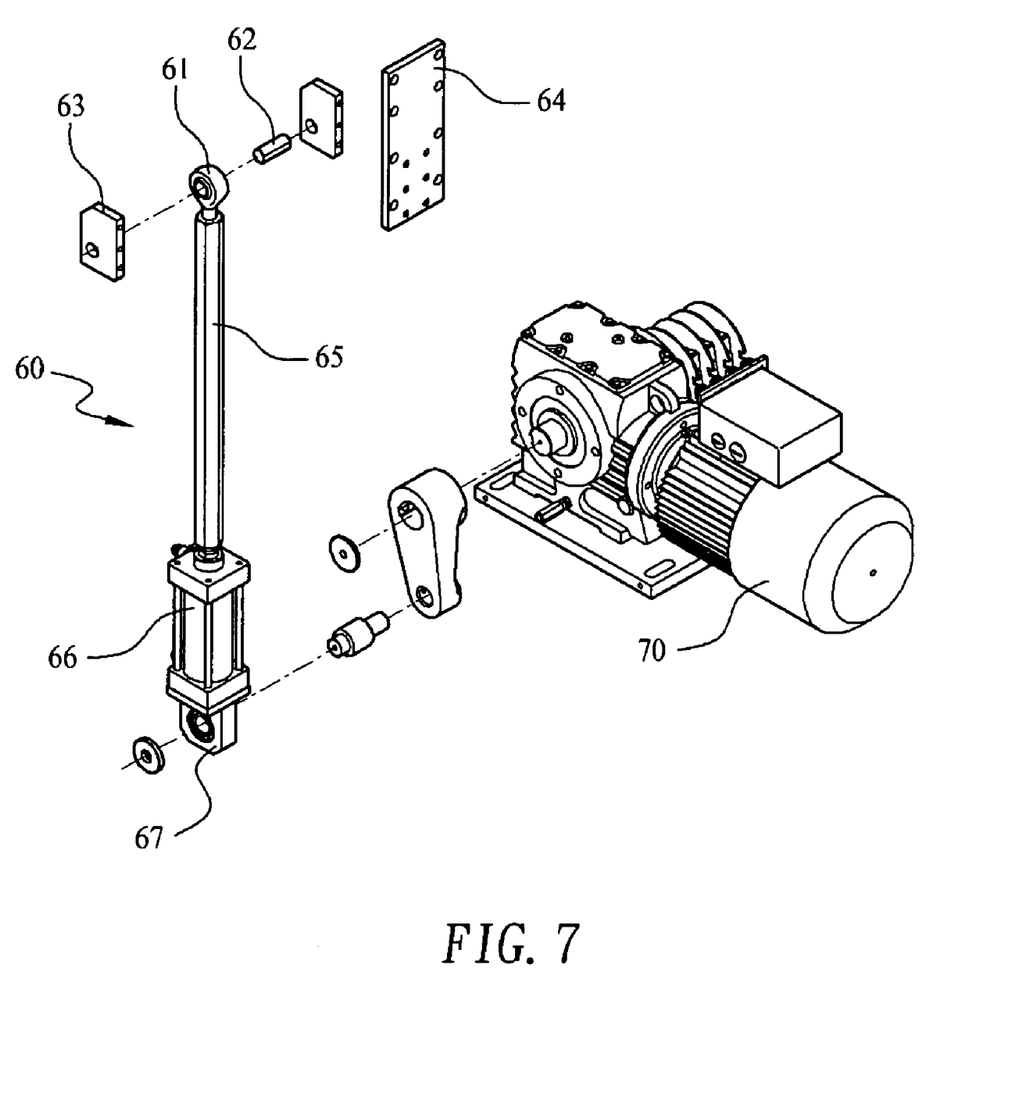
FIG. 7 is an exploded view of FIG. 6.

Please refer to FIGS. 6 and 7 that are assembled and exploded perspective views, respectively, of the eccentric shaft driving system 60. As shown, at a top of the eccentric shaft driving system 60, there is provided a rod-bearing 61, to which a force applying rod 62 is assembled. The force applying rod 62 is fixedly connected at two ends to a fixing member 63 each. The two fixing members 63 are fixedly connected to a rear side of a transmission block 64. A height-adjustable adjusting screw rod 65 is downward extended from the rod bearing 61, and a cylinder 66 is connected to a lower end of the adjusting screw rod 65. A pivoting support 67 is mounted to a lower end of the cylinder 66 for a reduction motor 70 to connect thereto, so that the reduction motor 70 provides power to drive the eccentric shaft driving system 60.

Figure 8:
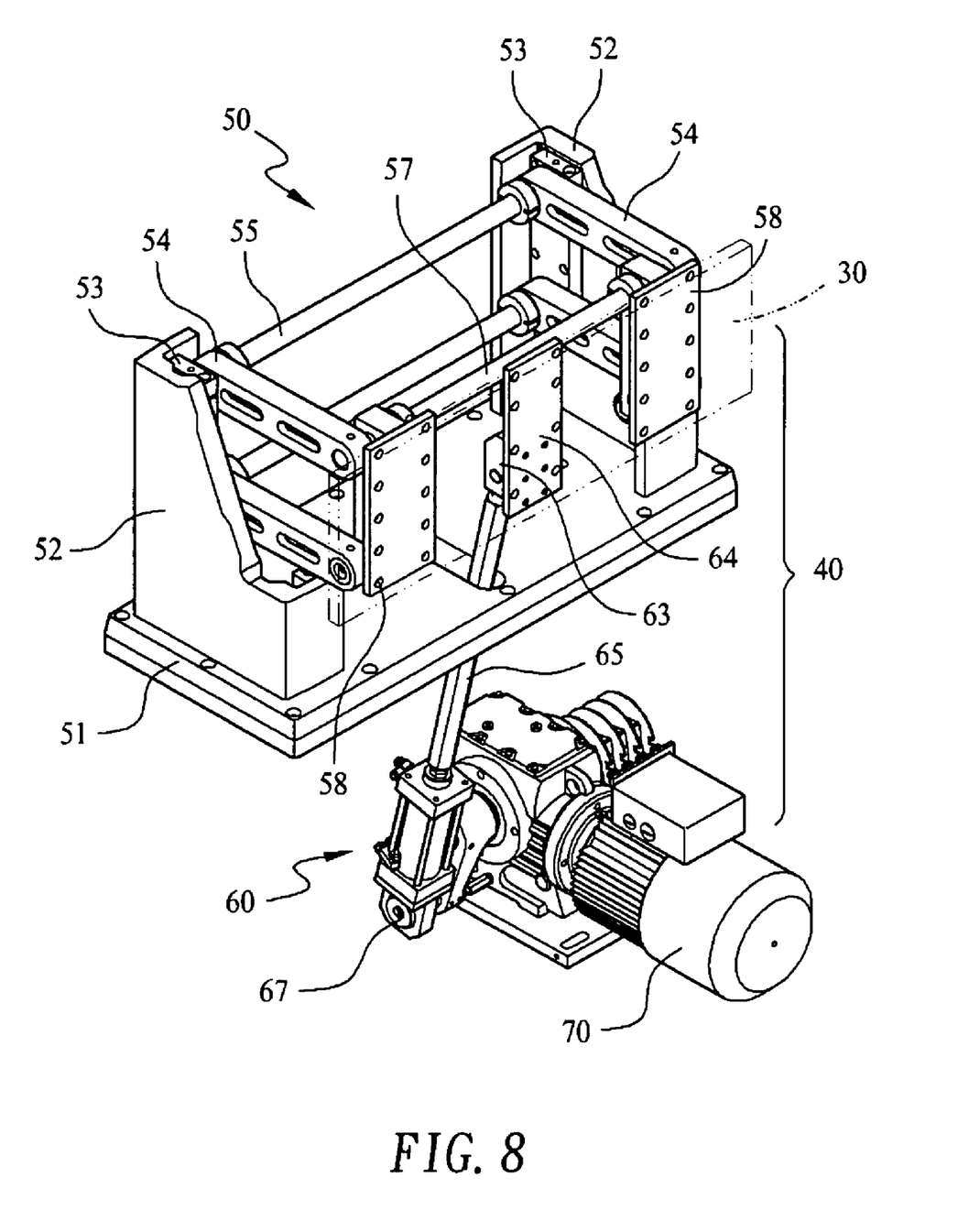
FIG. 8 shows the connection of the two-bar linkage fast elevating apparatus of the present invention to a transverse slide base of the screen printing machine.

As can be seen from FIG. 8, the two-bar linkage system 50 and the eccentric shaft driving system 60 are connected at the connecting blocks 58 and the transmission block 64, respectively, to the rear side of the transverse slide base 30 of the screen printing machine 1.

The cylinder 66 forming a constituent part of the eccentric shaft driving system 60 also serves as a safety buffering means in an emergency. When the screen printing machine 1 is in use, the reduction motor 70 would produce an instantaneous impact on the screen printing machine 1 at the instant of elevating and lowering the transverse slide base 30. Since the screen printing machine 1 is a high precision machine for highly accurate printing, any instantaneous impact on the screen printing machine 1 would inevitably adversely affect the printing accuracy and quality of the machine 1. With the cylinder 66, a buffering or shock-absorbing effect is provided to minimize any adverse influence on the screen printing machine 1 by the instantaneous impact produced by the reduction motor 70, enabling the screen printing machine 1 to have good printing quality and be more durable for use.

The cylinder 66 is in a retreated position under a normal condition. In case of an unexpected accident, in which, for example, an operator's hand is clamped between the printing bed 20 and the screen frame of the screen printing machine 1, the screen printing machine 1 can be immediately powered off to actuate a safety mechanism built in the machine 1, which causes the cylinder 66 to automatically extend upward and thereby lifts the transverse slide base 30, and separates the screen frame from the printing bed 20, allowing the operator to safely pull out the hand.

Please refer to FIGS. 1, 2, 3, and 7. The reduction motor 70 serves as a main driving means of the fast elevating apparatus 40 of the present invention. The reduction motor 70 is seated on a base 11 located at a lower part of the platform 10 with a crank of the reduction motor 70 pivotally connected at an outer end to the pivoting support 67 at the lower end of the eccentric shaft driving system 60. As having been described above, the rod bearing 61 at the upper end of the eccentric shaft driving system 60 is connected to the force applying rod 62, and the two-bar linkage system 50 and the eccentric shaft driving system 60 are connected to the transverse slide base 30. With these arrangements, the screen printing machine 1 may achieve a high-speed and highly-accurate printing operation.

Figure 9:
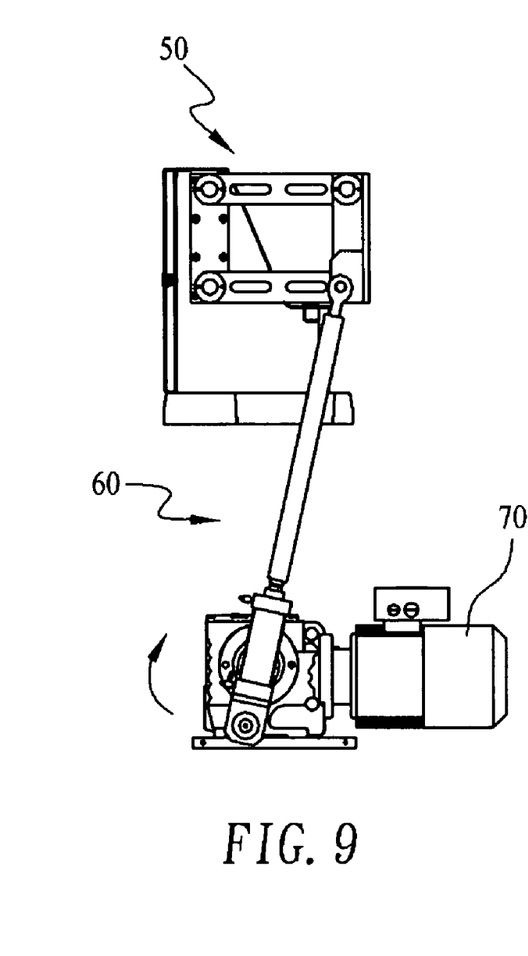
FIGS. 9, 10, 11, and 12 are side views showing sequential movements in the operation of the present invention.
Figure 10:
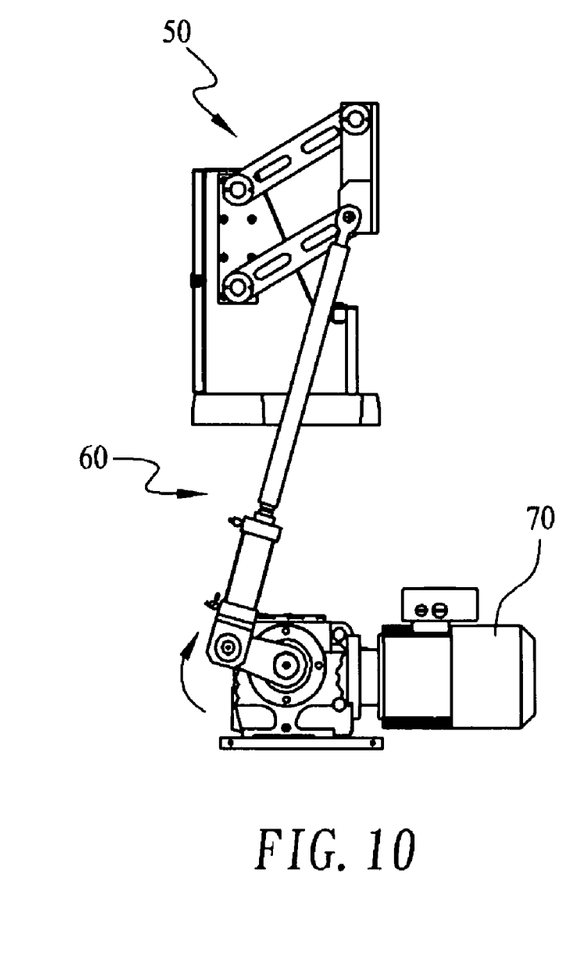
Figure 11:
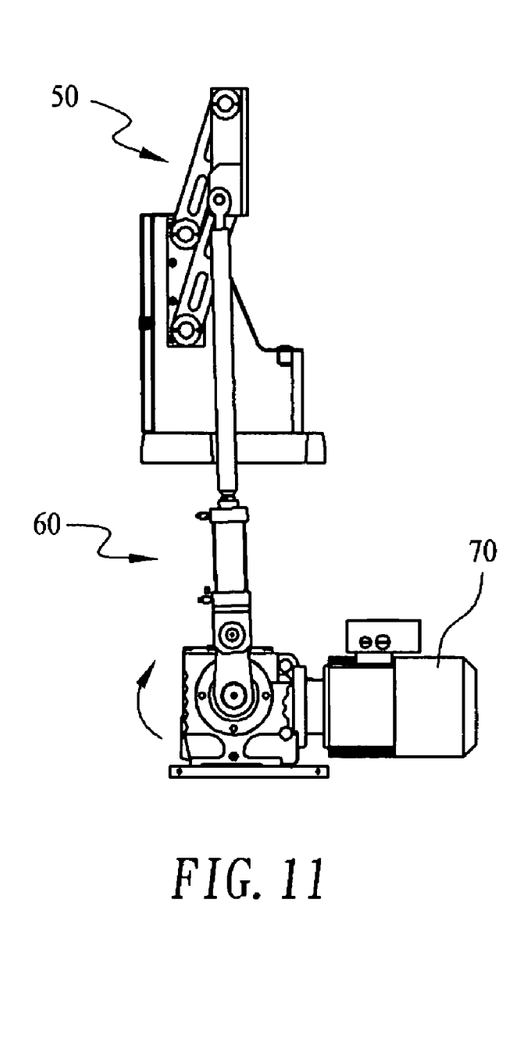
Figure 12:
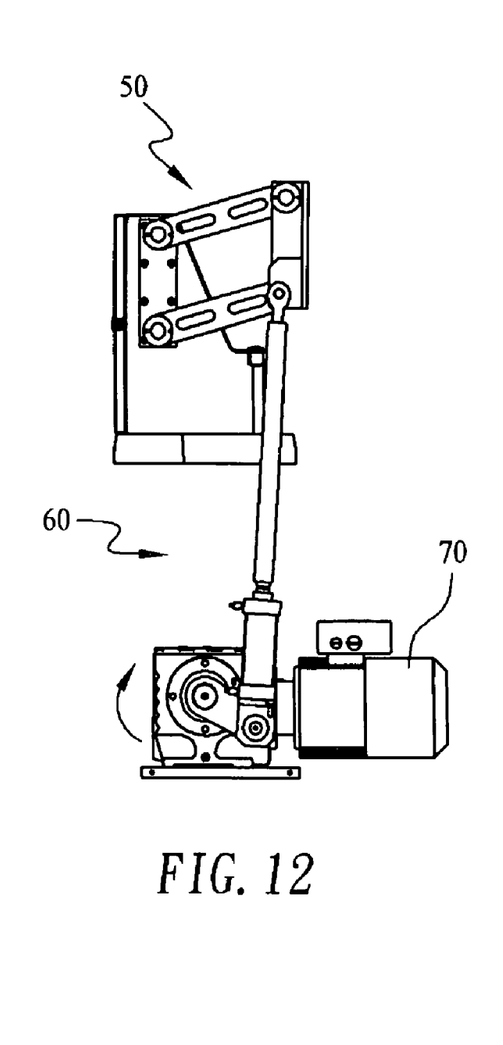

Also please refer to FIGS. 1 and 9 to 12. When the reduction motor 70 operates at a high speed to drive the eccentric shaft driving system 60, the transverse slide base 30 is stably lifted or lowered at a high speed. The reduction motor 70 is designed to rotate cyclically to change the working position of the two-bar linkage fast elevating apparatus 40, as shown in FIGS. 9 to 12. In FIG. 9, the apparatus 40 is in the lowest or printing position, in which the printing head 31 of the screen printing machine 1 is moved transversely to scrape ink on a screen mounted on the screen frame (not shown). When the printing head 31 is moved on the screen, it produces a downward pressure against the screen, causing the ink to penetrate through the screen to an object to be printed. When the printing is completed, the reduction motor 70 brings the apparatus 40 to the highest or standby position, as shown in FIG. 11, and the printing head 31 is transversely moved to an initial position (not shown) at the same time. Thereafter, the transverse slide base 30 is lowered again for the next printing.

As a common practice, the operator would check the printing quality each time the printing is completed. With the two-bar linkage system 50 and the eccentric shaft driving system 60, the two-bar linkage fast elevating apparatus 40 of the present invention lifts while rearward moves the transverse slide base 30 and the whole printing structure connected thereto, so that the space between the rearward lifted screen frame and the printing bed 20 is heightened and deepened to provide good vision, enabling the operator to more conveniently and quickly position the object to be printed, check the printing quality, and remove the printed object from the printing bed 20, and therefore ensuring increased good yield and productivity from the printing operation.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A two-bar linkage fast elevating apparatus for screen printing machine, said screen printing machine including a platform, a printing bed, and a transverse slide base; said transverse slide base having a cantilevered printing head forward extended therefrom to leftward and rightward slide along said transverse slide base, and being provided at two lateral ends thereof with two forward extended cantilevered arms, each of said two cantilevered arms being provided at a lower side with a clamping support for holding a screen frame between said two cantilevered arms; said two-bar linkage fast elevating apparatus comprising a two-bar linkage system and an eccentric shaft driving system, both of which are connected to a rear side of said transverse slide base;

said two-bar linkage system including a seat having a support upward extended from each lateral side thereof; two fixing plates symmetrically assembled to predetermined positions on inner wall surfaces of said two supports; two upper and two lower connecting bars, each of which has a first and a second end; an upper and a lower connecting shaft extended between said two fixing plates with two ends extended through said first end of said upper and lower connecting bars, respectively, into upper and lower ends, respectively, of said two fixing plates; and a link bar extended between said two upper connecting bars with two ends extended through two upper shaft holes separately provided at rear portions of two connecting blocks and then into said second end of said two upper connecting bars; and said two lower connecting bars being connected at said second end to two lower shaft holes separately provided at the rear portion of said two connecting blocks; and said eccentric shaft driving system including a rod bearing located at an upper end of said eccentric shaft driving system; a force applying rod assembled to said rod bearing; two fixing members fixedly connected to two ends of said force applying rod; a transmission block fixedly connected to a front side of said two fixing members; and a pivoting support located at a lower end of said eccentric shaft driving system.

2. The two-bar linkage fast elevating apparatus for screen printing machine as claimed in claim 1, wherein each of said two supports is provided at a predetermined position with a buffering device, and said buffering device being selected from the group consisting of air type, oil pressure type, and other mechanical type buffering devices.

3. The two-bar linkage fast elevating apparatus for screen printing machine as claimed in claim 1, wherein each of said two fixing plates in said two-bar linkage system is provided at said upper and lower ends with an upper and a lower mounting hole, respectively, into which two ends of said upper and lower connecting shafts are extended.

4. The two-bar linkage fast elevating apparatus for screen printing machine as claimed in claim 1, wherein each of said upper and lower connecting bars in said two-bar linkage system is provided at the first and the second end with a hole each, through which two ends of said upper and lower connecting shafts and said link bar are extended.

5. The two-bar linkage fast elevating apparatus for screen printing machine as claimed in claim 1, wherein said pivoting support of said eccentric shaft driving system is connected to a reduction motor.

6. The two-bar linkage fast elevating apparatus for screen printing machine as claimed in claim 1, wherein said eccentric shaft driving system includes a height-adjustable adjusting screw rod downward extended from said rod bearing.

7. The two-bar linkage fast elevating apparatus for screen printing machine as claimed in claim 1, wherein said eccentric shaft driving system includes a cylinder.

8. The two-bar linkage fast elevating apparatus for screen printing machine as claimed in claim 1, wherein said two-bar linkage system is covered with a top cover.

9. The two-bar linkage fast elevating apparatus for screen printing machine as claimed in claim 1, wherein said two-bar linkage system and said eccentric shaft driving system are connected at said two connecting blocks and said transmission block, respectively, to the rear side of said transverse slide base.

10. The two-bar linkage fast elevating apparatus for screen printing machine as claimed in claim 1, wherein said two lower connecting bars of said two-bar linkage system are connected to said lower shaft holes on the rear portion of said two connecting blocks via two fixing shafts that are assembled to the second end of said two lower connecting bars.

* * * * *